(12) United States Patent
Hsien et al.

(10) Patent No.: US 10,719,652 B2
(45) Date of Patent: Jul. 21, 2020

(54) ELECTROMIGRATION SIGN-OFF TOOL

(71) Applicant: Taiwan Semiconductor Manufacturing Co., Ltd., Hsin-Chu (TW)

(72) Inventors: Yu-Tseng Hsien, Tongxiao Township (TW); Chin-Shen Lin, Taipei (TW); Ching-Shun Yang, Zhudong Township (TW); Jui-Feng Kuan, Zhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 16/460,063

(22) Filed: Jul. 2, 2019

(65) Prior Publication Data
US 2019/0325105 A1 Oct. 24, 2019

Related U.S. Application Data

(62) Division of application No. 16/046,142, filed on Jul. 26, 2018, now Pat. No. 10,346,576, which is a
(Continued)

(51) Int. Cl.
*G06F 30/392* (2020.01)
*H01L 21/768* (2006.01)
(Continued)

(52) U.S. Cl.
CPC .......... *G06F 30/392* (2020.01); *G06F 30/367* (2020.01); *G06F 30/398* (2020.01); *H01L 21/768* (2013.01); *G01R 31/2858* (2013.01)

(58) Field of Classification Search
USPC ......................................................... 438/5
See application file for complete search history.

(56) References Cited

U.S. PATENT DOCUMENTS

2005/0204314 A1 9/2005 Hou et al.
2006/0066337 A1 3/2006 Kang et al.
(Continued)

FOREIGN PATENT DOCUMENTS

KR 20130026416 A 3/2013

OTHER PUBLICATIONS

Steele, et al. "Full-Chip Verication Methods for DSM Power Distribution Systems." 35th Design Automation Conference. San Francisco, CA USA. Jun. 1998.
(Continued)

*Primary Examiner* — Mohammed Alam
(74) *Attorney, Agent, or Firm* — Eschweiler & Potashnik, LLC (57) ABSTRACT

The present disclosure, in some embodiments, relates to an electromigration sign-off tool. The tool includes electronic memory configured to store an integrated chip design and an environmental temperature having a same value corresponding to a plurality of interconnect wires within the integrated chip design. An adder is configured to add the environmental temperature to a plurality of real temperatures to determine a plurality of actual temperatures having different values corresponding to different ones of the plurality of interconnect wires. The plurality of real temperatures account for Joule heating on the plurality of interconnect wires. An average current limit calculation element is configured to determine an average current limit at a first one of the plurality of actual temperatures. A comparator is configured to determine an electromigration violation on a first interconnect wire by comparing the average current limit to an average current of the first interconnect wire.

20 Claims, 6 Drawing Sheets

Related U.S. Application Data division of application No. 15/271,301, filed on Sep. 21, 2016, now Pat. No. 10,042,967.

(60) Provisional application No. 62/255,747, filed on Nov. 16, 2015.

(51) Int. Cl.
*G06F 30/367* (2020.01)
*G06F 30/398* (2020.01)
*G01R 31/28* (2006.01)

(56) References Cited

U.S. PATENT DOCUMENTS

| | | | |
|---|---|---|---|
| 2006/0226142 | A1 | 10/2006 | Gill et al. |
| 2009/0132985 | A1* | 5/2009 | Hsu .................... G06F 17/5036 716/122 |
| 2009/0326873 | A1* | 12/2009 | Wang .................... G06F 17/505 703/1 |
| 2011/0074498 | A1 | 3/2011 | Thompson et al. |
| 2013/0212544 | A1* | 8/2013 | Yu ....................... G06F 17/5081 716/55 |
| 2013/0298101 | A1* | 11/2013 | Chandra ................. G06F 17/50 716/136 |
| 2017/0141003 | A1* | 5/2017 | Hsien .................... H01L 21/768 |
| 2018/0330036 | A1* | 11/2018 | Hsien .................... H01L 21/768 |
| 2019/0325105 | A1* | 10/2019 | Hsien .................. G06F 17/5072 |

OTHER PUBLICATIONS

Chan, et al. "Methodology for Electromigration Signoff in the Presence of Adaptive Voltage Scaling." ACM/IEEE International Workshop on System-Level Interconnect Prediction, Jun. 2014, pp. 1-7.

Pop, Eric. "Self-Heating and Scaling of Thin Body Transistors." University of Stanford Dissertation. Dec. 2004.

Bailey, Brian. "Thermally Challenged." Semiconductor Engineering. Dec. 5, 2013.

Jerke, et al. "Hierarchical Current-Density Verification in Arbitrarily Shaped Metallization Patterns of Analog Circuits." IEEE Transactions on Computer-Aided Design of Integrated Circuits and Systems, vol. 23, No. 1, Jan. 2004.

Non-Final Office Action dated Sep. 7, 2017 for U.S. Appl. No. 15/271,301.

Notice of Allowance dated Mar. 22, 2018 for U.S. Appl. No. 15/271,301.

Non-Final Office Action dated Jan. 29, 2019 for U.S. Appl. No. 16/046,142.

Notice of Allowance dated May 14, 2019 for U.S. Appl. No. 16/046,142.

* cited by examiner

ELECTROMIGRATION SIGN-OFF TOOL

REFERENCE TO RELATED APPLICATIONS

This application is a Divisional of U.S. application Ser. No. 16/046,142, filed on Jul. 26, 2018, which is a Divisional of U.S. application Ser. No. 15/271,301, filed on Sep. 21, 2016 (now U.S. Pat. No. 10,042,967, issued on Aug. 7, 2018), which claims the benefit of U.S. Provisional Application No. 62/255,747 filed on Nov. 16, 2015. The contents of the above-referenced patent applications are hereby incorporated by reference in their entirety.

BACKGROUND

Electromigration is the transport of atoms within a conductive material, which is caused by collisions that transfer momentum between conducting electrons and the atoms of the conductive material. Modern day integrated chips often experience electromigration in metal interconnect layers. For example, as electrons carry a current to a semiconductor device, the electrons collide with metal atoms in the metal interconnect layers. The collisions cause metal atoms within the metal interconnect layers to move (i.e., undergo electromigration), resulting in voids in the metal interconnect layers that can lead to integrated chip failure.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As the size of metal interconnect layers has decreased due to scaling, electromigration has become an increasing reliability concern for integrated chips. This is because the smaller size of the metal interconnect layers increases a current density of signals conveyed by the metal interconnect layers. Since electromigration is proportional to current density, the increased current density also increases electromigration.

To ensure that integrated chips meet a minimum reliability standard, integrated chips undergo electromigration (EM) sign-off. Typically, EM sign-off is performed in two stages. A first stage of EM sign-off compares a global RMS temperature change (determined from an RMS current of multiple electrical networks of an integrated chip) to a predetermined temperature limit to identify EM violations (to make sure the temperature generated from RMS current is below a selected amount). Violations of the predetermined temperature limit indicate an EM violation is present, since higher temperatures increase electromigration by providing thermal energy that increases the frequency of collisions between electrons and metal atoms within metal interconnect layers. The second stage of EM sign-off compares an average current to a predetermined average current limit to identify EM violations due to current density (since EM is proportional to current density).

Both stages of EM sign-off are performed on a plurality of electrical networks of an integrated chip and depend on the global RMS temperature change. For example, if an environmental temperature is 110° C. and a global RMS temperature change is 10° C., average current limits for the plurality of electrical networks may be calculate at an elevated temperature of 120° C. However, it has been appreciated that using a same elevated temperature for the plurality of electrical networks may be too pessimistic for certain electrical networks and therefore may induce additional design area overhead by identifying false EM violations. Moreover, the separate stages of EM sign-off make area optimization difficult since the separate stages may yield different results that drive further overhead. Furthermore, both stages fail to account for self-heating from transistor devices.

The present disclosure relates to an electromigration (EM) sign-off methodology that determines EM violations of components (e.g., metal interconnect wires) on different electrical networks of an integrated chip design by performing a single EM check on separate components using separate temperatures. In some embodiments, the method determines a plurality of actual temperatures that respectively correspond to one or more components within one of a plurality of electrical networks within an integrated chip design. An electromigration margin is determined for a component within a selected electrical network of the plurality of electrical networks. The electromigration margin is determined at one of the plurality of actual temperatures that corresponds to the component within the selected electrical network. The electromigration margin is compared to an electromigration metric to determine if an electromigration violation of the component within the selected electrical network is present. The use of separate actual temperatures for components on different electrical networks mitigates false EM violations, thereby reducing loss of design overhead. Furthermore, the use of a single EM check on a component eliminates deviations between separate EM sign-off methods.

Figure 1:
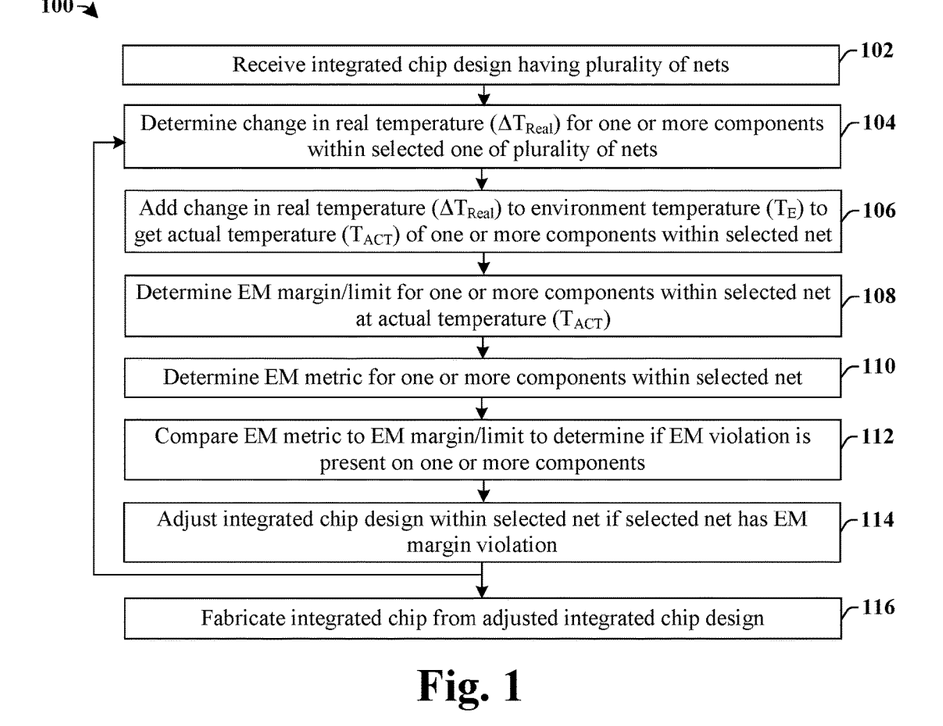
FIG. 1 illustrates a flow diagram of some embodiments of a method of performing electromigration (EM) sign-off that uses separate temperatures to determine EM violations of components within different electrical networks.

FIG. 1 illustrates a flow diagram of some embodiments of a method 100 of performing electromigration (EM) sign-off that determines EM violations within different electrical networks using different temperatures.

At 102, an integrated chip design (i.e., layout) having a plurality of electrical networks (i.e., 'nets') is received. The plurality of electrical networks respectively comprise one or more components within the integrated chip design that are electrically connected or coupled together. For example, the plurality of electrical networks may respectively comprise separate groups of metal interconnect layers (e.g., metal interconnect wires and metal vias), which are electrically connected or coupled to separate power bus wires (e.g., a wire held at $V_{SS}$ or $V_{DD}$) configured to supply power to circuit elements. In some embodiments, components on separate electrical networks may be electrically isolated from one another.

At 104, a change in real temperature ($\Delta T_{real}$) is determined for one or more components (e.g., metal interconnect wires) within a selected one of the plurality of electrical networks. The change in real temperature ($\Delta T_{real}$) comprises a change in a temperature of the one or more components within the selected electrical network due to heat generated within the selected electrical network. For example, in various embodiments, the change in real temperature ($\Delta T_{real}$) may be due to joule heating of a metal interconnect wire within the selected electrical network and/or heat generated from one or more transistor devices (i.e., self-heating) within the selected electrical network (i.e., heat due to the collision of charge carriers with semiconductor molecules within a channel region of a transistor device). In some embodiments, the change in real temperature ($\Delta T_{real}$) may be different for different ones of the plurality of electrical networks and/or for different components within a same electrical network.

At 106, the change in real temperature ($\Delta T_{real}$) is added to an environment temperature ($T_E$) to get an actual temperature ($T_{ACT}$) for the one or more components within the selected electrical network. The environmental temperature ($T_E$) may be set to have a same value for different electrical networks of the integrated chip design. In some embodiments, the environmental temperature ($T_E$) may have a value that is selected to be greater than that of a substrate or metal interconnect wire, so as to accelerate EM testing and lead to EM failures over a respectively short period of time (since the real lifetime of an integrated chip in the field is greater than a time allotted for EM sign-off). For example, the environmental temperature may have a value that is selected to lead to integrated chip failure over a predetermined period of time. In some embodiments, the environmental temperature ($T_E$) may be a variable set by a process engineer (e.g., based upon on-chip data).

At 108, an electromigration (EM) margin/limit is determined for the one or more components within a selected electrical network at the actual temperature ($T_{ACT}$). The electromigration margin/limit is an acceptable upper limit of a value of an electromigration metric for the one or more components within an electrical network. If the value of an electromigration metric exceeds the electromigration margin/limit, there is an electromigration concern in the one or more components within the electrical network and an EM violation is identified. In some embodiments, the EM margin/limit may comprise an average current limit determined at the actual temperature. In other embodiments, the EM metric/limit may comprise a mean-time to failure (MTTF) limit determined at the actual temperature.

At 110, an electromigration metric is determined for the one or more components within the selected electrical network. In some embodiments, the electromigration metric may be an average current on the one or more components within the selected electrical network. In other embodiments, the electromigration metric may be a MTTF. The electromigration metric may be determined from a simulation of the integrated chip design.

At 112, the EM metric is compared to the EM margin/limit to determine if an EM violation is present in the one or more components.

At 114, if an EM violation is identified, one or more design layers corresponding to the one or more components within the selected electrical network are adjusted. For example, if an electromigration average current violates a current margin/limit, one or more design layers corresponding to the one or more components within the selected electrical network of the integrated chip design are adjusted to mitigate EM violations on the selected electrical network.

It will be appreciated that acts 102-114 may be iteratively repeated to determine and eliminate EM violations of different components on an electrical network and/or of components within different ones of the plurality of electrical networks. For example, acts 102-114 may be performed a first time to determine EM violations on one or more components within a first electrical network, a second time to determine EM violations on one or more components within a second electrical network, etc. Since components on each electrical network may have different temperatures, the EM margin/limit of components on each electrical network may be different. Therefore, EM violations may be determined on a net-by-net basis, reducing unnecessary redesign of electrical networks not having EM violations.

Once EM violations have been determined within a plurality of electrical network and EM sign-off has been completed, the integrated chip design may be fabricated on a semiconductor substrate from an adjusted integrated chip design, at 116.

Figure 2A:
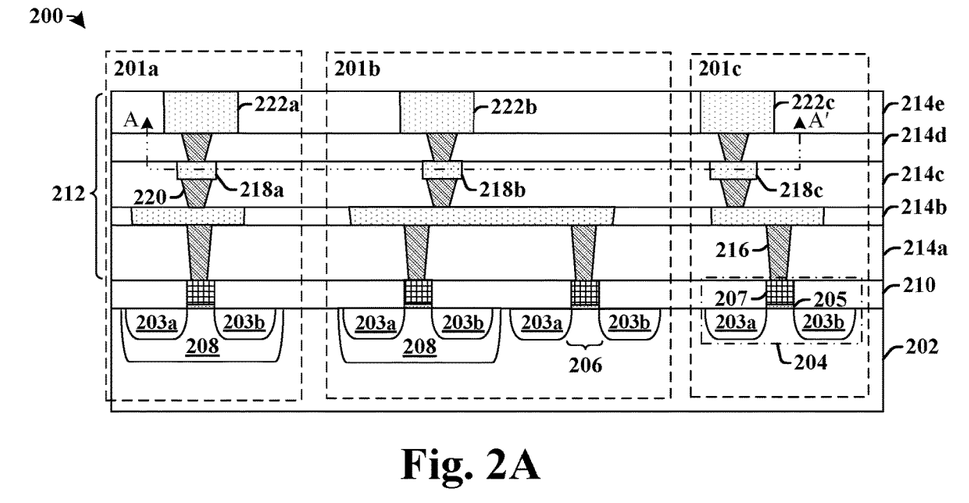
FIGS. 2A-2B illustrate some embodiments of an integrated chip comprising a plurality of different electrical networks.
Figure 2B:
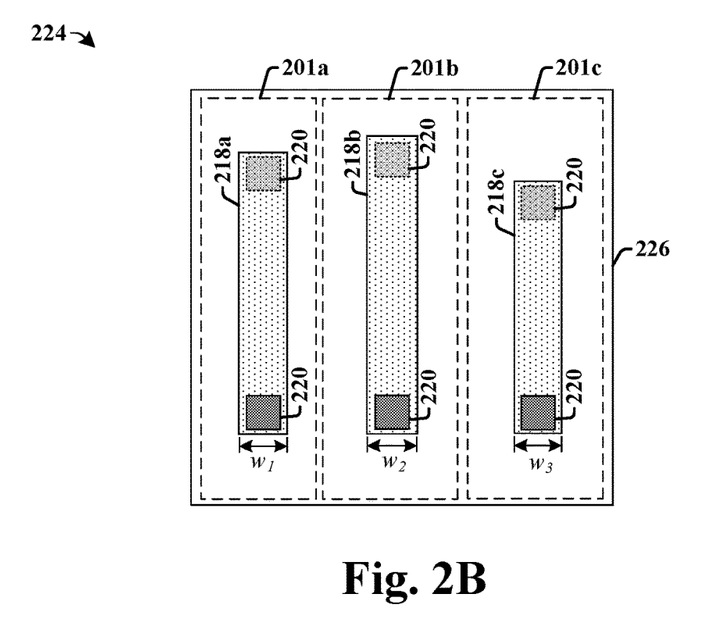

FIGS. 2A-2B illustrates some embodiments of an integrated circuit having a plurality of electrical networks.

FIG. 2A illustrates a cross-sectional view of some embodiments of an integrated chip 200 having a plurality of electrical networks 201a-201c. The integrated chip 200 comprises a plurality of transistor devices 204 arranged within a substrate 202. In various embodiments, the substrate 202 may comprise any type of semiconductor body (e.g., silicon, SiGe, SOI, etc.) such as a semiconductor wafer and/or one or more die on a wafer.

The plurality of transistor devices 204 respectively comprise a source region 203a and a drain region 203b separated by a channel region 206. The source region 203a and the drain region 203b comprise highly doped regions (e.g., having a doping concentration greater than that of the surrounding substrate 202). In some embodiments, the source region 203a and the drain region 203b may be arranged within a well region 208 having a doping type different than that of the substrate 202 (e.g., an n-type well region may be arranged within a p-type substrate). A gate structure is arranged over the channel region 206. The gate structure is configured to control a flow of charge carriers (e.g., holes or electrons) within the channel region 206 during operation of a transistor device 204. The gate structure comprises a gate electrode 207 separated from the channel region 206 by a gate dielectric 205. In some embodiments, the gate structure is surrounded by a dielectric layer 210 (e.g., phosphorus silicate glass).

A back-end-of-the-line (BEOL) metallization stack 212 is arranged over the substrate 202. The BEOL metallization stack 212 comprises a plurality of metal interconnect layers arranged within a dielectric structure having one or more dielectric layers 214a-214e. In various embodiments, the one or more dielectric layers 214a-214e may comprise an oxide, an ultra-low k dielectric material, and/or a low-k dielectric material (e.g., SiCO). In some embodiments, the plurality of metal interconnect layers may comprise conductive contacts 216, metal interconnect wires 218a-218c, and/or metal vias 220. The conductive contacts 216 electrically couple the transistor devices 204 to the metal interconnect wires 218a-218c, which are separated by the metal vias 220.

The plurality of electrical networks 201a-201c respectively comprise a plurality of metal interconnect layers that are electrically coupled together. For example, in some embodiments, a first electrical network 201a may comprise a plurality of metal interconnect layers coupled to a first power bus wire 222a configured to provide power (e.g., held at $V_{SS}$) to transistor devices within the first electrical network 201a, while a second electrical network 201b may comprise a plurality of metal interconnect layers coupled to a second power bus wire 222b configured to provide power (e.g., held at $V_{SS}$) to transistor devices within the second electrical network 201b. In some embodiments, metal interconnect layers within different electrical networks are electrically isolated from one another.

The metal interconnect wires within the different electrical networks 201a-201c have different actual temperatures due to different changes in real temperature ($\Delta T_{real}$) due to resistive heating and/or device self-heating. For example, in some embodiments, the changes in real temperature ($\Delta T_{real}$) for metal interconnect wires in a selected electrical network may depend upon an RMS current on the metal interconnect wires in the selected electrical network. Since metal interconnect wires within different electrical networks 201a-201c have different RMS currents, the metal interconnect wires within different electrical networks 201a-201c have different changes in real temperature. In some embodiments, a same electrical network 201a-201c may have different changes in real temperature ($\Delta T_{real}$) among different segments of the electrical network, since the electrical network may have several branches of metal interconnect wires carrying different RMS currents.

In some embodiments, the first electrical network 201a may have a first metal interconnect wire carrying a first RMS current that corresponds to a first change in real temperature ($\Delta T_{real\_1}$), the second electrical network 201b may have a second metal interconnect wire carrying a second RMS current that corresponds a second change in real temperature ($\Delta T_{real\_2}$), and the third electrical network 201c may have a third metal interconnect wire carrying a third RMS current that corresponds a third change in real temperature ($\Delta T_{real\_3}$). In various embodiments, two or more of the first change in real temperature ($\Delta T_{real\_1}$), the second change in real temperature ($\Delta T_{real\_2}$), and the third change in real temperature ($\Delta T_{real\_3}$) may be different.

FIG. 2B illustrates a top-view 224 of an integrated chip design 226 associated with integrated chip 200. As shown in top-view 224, the first electrical network 201a comprises a first metal wire 218a having a first width $w_1$, the second electrical network 201b comprises a second metal wire 218b having a second width $w_2$, and the third electrical network 201c comprises a third metal wire 218c having a third width $w_3$. In some embodiments, the first width $w_1$ may be the same as the second width $w_2$ and the third width $w_3$. In other embodiments, the first width $w_1$, the second width $w_2$, and/or the third width $w_3$ may be different.

Figure 3A:
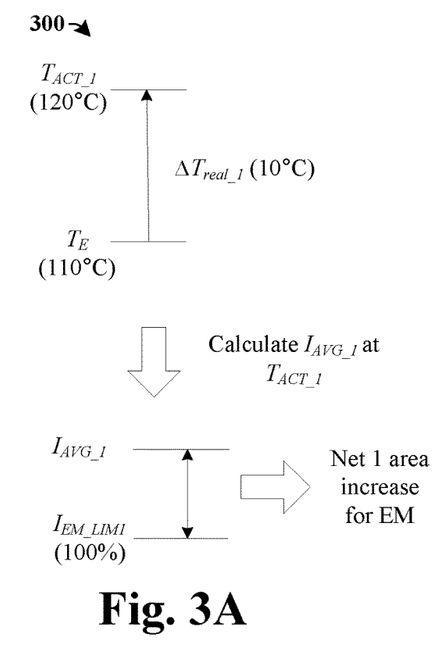
FIGS. 3A-3C illustrate some embodiments of diagrams showing examples of determining EM violations by way of an average EM current using different actual temperatures for components within the different electrical networks of FIGS. 2A-2B.
Figure 3B:
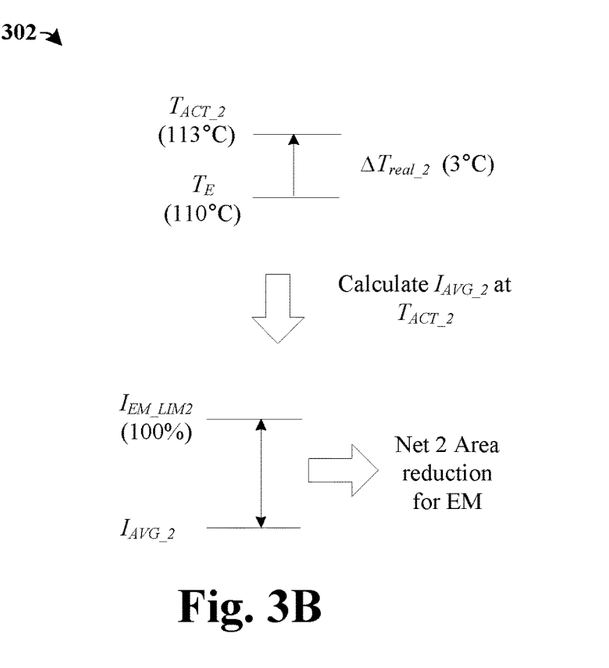
Figure 3C:
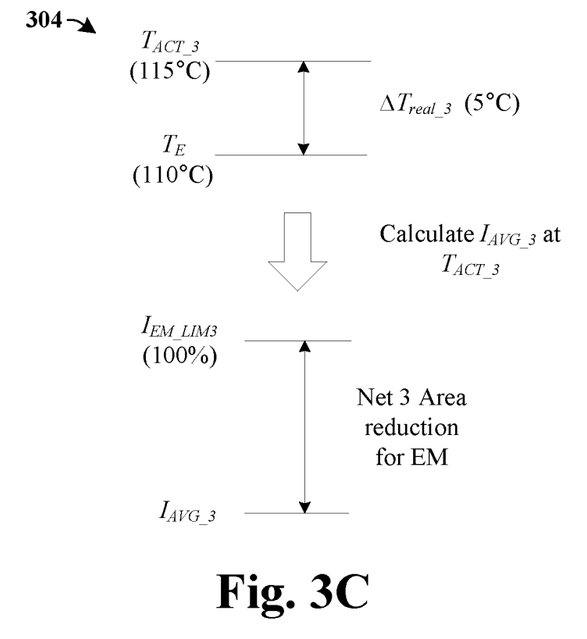

FIGS. 3A-3C illustrate some embodiments of diagrams 300-304 showing examples of a disclosed EM sign-off process that determines EM violations using separate changes in real temperature ($\Delta T_{real\_x}$) for the metal interconnect wires on the different electrical networks (e.g., 201a-201c) of FIGS. 2A-2B. The EM sign-off process is configured to determine an average EM current ($I_{AVG\_x}$) of metal interconnect wires on the respective electrical networks at separate actual temperatures ($\Delta T_{ACT\_x}$). As an actual temperature ($\Delta T_{ACT\_x}$) increases, a corresponding EM current limit ($I_{EM\_LIMx}$) decreases since higher temperatures increase electromigration. Therefore, using separate actual temperatures for the metal interconnect wires on the different electrical networks allows for the metal interconnect wires on the different electrical networks to be treated differently, thereby preventing the need to adjust metal interconnect wires on electrical networks of an integrated chip design that are not likely to cause EM issues.

As shown in diagram 300 of FIG. 3A, a first metal interconnect wire on a first electrical network (e.g., 201a of FIG. 2A) has a first actual temperature ($T_{ACT\_1}$) that is equal to a sum of an environmental temperature ($T_E$) and a change in real temperature of the first metal interconnect wire on the first electrical network ($\Delta T_{real\_1}$) (i.e., $T_{ACT\_1}=T_E+\Delta T_{real\_1}$) For example, if the environmental temperature ($T_E$) is equal to 110° C. and the change in real temperature of the first network ($\Delta T_{real\_1}$) is equal to 10° C., the first actual temperature ($T_{ACT\_1}$) is equal to 120° C. An average EM current limit of the first metal interconnect wire on the first electrical network ($I_{EM\_LIM1}$) is calculated at the first actual temperature ($T_{ACT\_1}$) and is compared to an average current of the first metal interconnect wire on the first electrical network ($I_{AVG\_1}$). Since the average current of the first metal interconnect wire on the first network ($I_{AVG\_1}$) is greater than the average EM current limit of the first metal interconnect wire on the first electrical network ($I_{EM\_LIM1}$), the first metal interconnect wire on the first electrical network is redesigned to reduce electromigration (e.g., a width of the first metal interconnect wire on the first electrical network is increased to reduce current density).

As shown in diagram 302 of FIG. 3B, a second metal interconnect wire on a second electrical network (e.g., 201b of FIG. 2A) has a second actual temperature ($T_{ACT\_2}$) that is equal to a sum of the environmental temperature ($T_E$) and a change in real temperature of the second metal interconnect wire on the second electrical network ($\Delta T_{real\_2}$) (i.e., $T_{ACT\_2}=T_E+\Delta T_{real\_2}$). For example, if the environmental temperature ($T_E$) is equal to 110° C. and change in real temperature of the second metal interconnect wire on the second electrical network ($\Delta T_{real\_2}$) is equal to 3° C., the second actual temperature ($T_{ACT\_2}$) is equal to 113° C. An average EM current limit of the second metal interconnect wire on the second electrical network ($I_{EM\_LIM2}$) is calculated at the second actual temperature ($T_{ACT\_2}$) and is compared to an average current of the second metal interconnect wire on the second electrical network ($I_{AVG\_2}$). Since the average current of the second metal interconnect wire on the second electrical network ($I_{AVG\_2}$) is greater than the average EM current limit of the second metal interconnect wire on the second electrical network ($I_{EM\_LIM2}$), the second metal interconnect wire on the second electrical network is not redesigned to reduce electromigration (e.g., the width of the second metal interconnect wire on the second electrical network is not increased). Rather, the second metal interconnect wire on the second electrical network may be left untouched or redesigned to make the integrated circuit design more compact.

As shown in diagram 304 of FIG. 3C, a third metal interconnect wire on a third electrical network (e.g., 201c of FIG. 2A) has a third actual temperature ($T_{ACT\_3}$) that is equal to a sum of the environmental temperature ($T_E$) and a change in real temperature of the third metal interconnect wire on the third electrical network ($\Delta T_{real\_3}$) (i.e., $T_{ACT\_3}=T_E+\Delta T_{real\_3}$). For example, if the environmental temperature ($T_E$) is equal to 110° C. and change in real temperature of the third metal interconnect wire on the third electrical network ($\Delta T_{real\_3}$) is equal to 5° C., the third actual temperature ($T_{ACT\_3}$) is equal to 115° C. An average EM current limit of the third metal interconnect wire on the third electrical network ($I_{EM\_LIM3}$) is calculated at the third actual temperature ($T_{ACT\_3}$) and is compared to an average current of the third metal interconnect wire on the third electrical network ($I_{AVG\_3}$). Since the average current of the third metal interconnect wire on the third electrical network ($I_{AVG\_3}$) is greater than the average EM current limit of the third metal interconnect wire on the third electrical network ($I_{EM\_LIM3}$), the third metal interconnect wire on the third network is not redesigned to reduce electromigration. Rather, the third metal interconnect wire on the third electrical network may be left untouched or a width of redesigned to make the integrated circuit design more compact.

Figure 4:
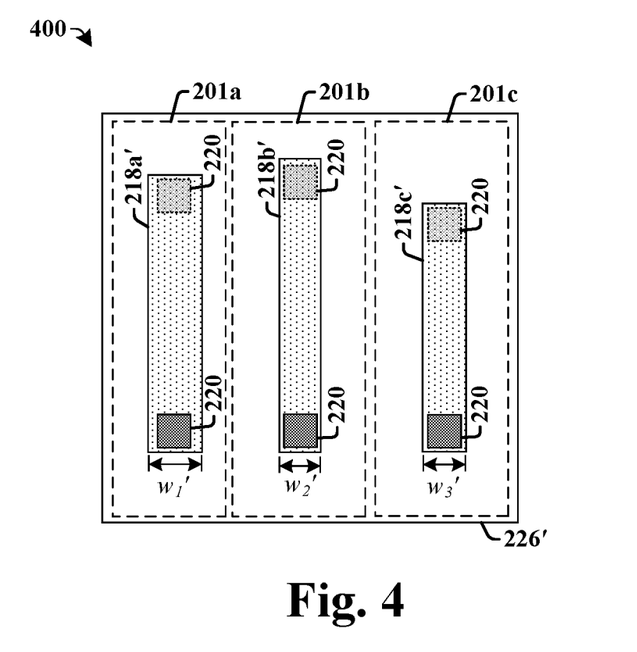
FIG. 4 illustrates a top-view of some embodiments showing adjustments of a design layer of electrical networks based on the EM violations identified in FIGS. 3A-3C.

FIG. 4 illustrates a top-view 400 of some embodiments showing adjustments of an integrated chip design on a net-by-net basis to account for violations of EM margins of FIGS. 3A-3C. Because the integrated chip design is adjusted on a net-by-net basis, unnecessary increases in design overhead can be mitigated.

Top-view 400 illustrates an adjusted integrated chip design 226'. In the adjusted integrated chip design 226', the first metal interconnect wire 216a' associated with the first electrical network 201a has been adjusted to account for EM violations by increasing a width of the first metal interconnect wire 216a' from a first width $w_1$ to an adjusted first width $w_1$' that is larger than the first width $w_1$. The width of the first metal interconnect wire 216a' associated with the first electrical network 201a is increased since the average current of first metal interconnect wire on the first network ($I_{AVG\_1}$) is greater than the average EM current limit of the first metal interconnect wire on the first electrical network ($I_{EM\_LIM1}$). Increasing the width of the first metal interconnect wire 216a' decreases EM violations on the first electrical network 201a since it increases an average EM current limit of the first metal interconnect wire on the first electrical network 201a.

In the adjusted integrated chip design 226', the second metal interconnect wire 216b' associated with the second electrical network 201b has been adjusted by decreasing a width of the second metal interconnect wire 216b' from a second width $w_2$ to an adjusted second width $w_2$' that is smaller than the second width $w_2$. Since average current of the second metal interconnect wire on the second electrical network ($I_{AVG\_2}$) is less than the average EM current limit of the second metal interconnect wire on the metal interconnect wire on the second electrical network ($I_{EM\_LIM2}$), a width of the second metal interconnect wire 216b' associated with the second electrical network 201b may be reduced to the adjusted second width $w_2$' without causing EM violations. In some alternative embodiments, the second width $w_2$ of the second metal interconnect wire 216b' may be not adjusted.

In the adjusted integrated chip design 226', the third metal interconnect wire 216c' associated with the third electrical network 201c has been adjusted by decreasing a width of the third metal interconnect wire 216c' from a third width $w_3$ to an adjusted third width $w_3$' that is smaller than the third width $w_3$. Since average current of the third metal interconnect wire on the third electrical network ($I_{AVG\_3}$) is less than the average EM current limit of the third metal interconnect wire on the third electrical network ($I_{EM\_LIM3}$), a width of the third metal interconnect wire 216c' associated with the third electrical network 201c may be reduced to the adjusted third width $w_3$' without causing EM violations. In some alternative embodiments, the third width $w_3$ of the third metal interconnect wire 216c' may be not adjusted.

Figure 5:
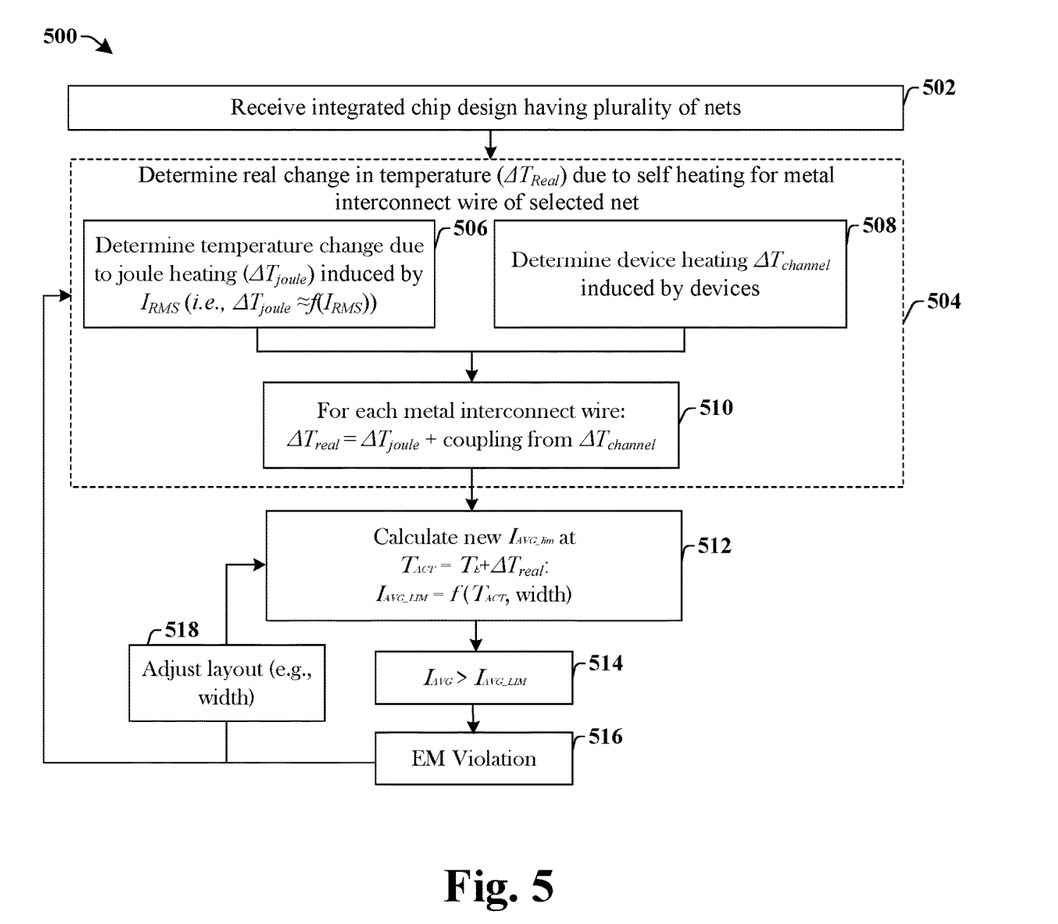
FIG. 5 illustrates a flow diagram of some additional embodiments of a method of performing EM sign-off that accounts for device self-heating and resistive heating.

FIG. 5 illustrates a flow diagram of a more detailed embodiment of a method 500 of performing electromigration (EM) sign-off that accounts for device self-heating and resistive heating.

While the disclosed methods (e.g., methods 100 and 500) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 502, an integrated chip design (i.e., layout) having a plurality of electrical networks is received.

At 504, a change in real temperature ($\Delta T_{real}$) is determined for a metal interconnect wire on a selected electrical network. In some embodiments, the change in real temperature may comprise a change in real temperature due to device self-heating and joule heating as determined by acts 506-510.

At 506, a change in temperature due to joule heating ($\Delta T_{real}$) is determined for a metal interconnect wire on a selected electrical network. The change in temperature due to joule heating ($\Delta T_{joule}$) (i.e., resistive heating) is proportional to the RMS current of the metal interconnect wire on the selected electrical network ($I_{RMS}$). For example, an RMS current of 5 mA may result in a change in temperature due to joule heating of 5° C. In some embodiments, the change in temperature due to joule heating ($\Delta T_{joule}$) may be dependent upon a process and/or a size of features within a technology node. In such embodiments, the change in temperature due to joule heating ($\Delta T_{joule}$) may be determined from a formula denoted in a design rule manual. In other embodiments, the change in temperature due to joule heating ($\Delta T_{joule}$) may be determined based upon a simulation run on the integrated chip design.

At 508, a change in temperature due to device self-heating ($\Delta T_{channel}$) is determined for the metal interconnect wire of the selected electrical network. In some embodiments, the change in temperature due to device self-heating ($\Delta T_{channel}$) may be calculated by determining a self-heating temperature of a device from a separate simulation (e.g., a spice simulation), and then determining the impact of the device self-heating on the metal interconnect wire.

At 510, a change in real in temperature ($\Delta T_{real}$) is determined for the metal interconnect wire based upon the change in temperature due to joule heating ($\Delta T_{joule}$) and the change in temperature due to device self-heating ($\Delta T_{channel}$). In some embodiments, the change in real temperature ($\Delta T_{real}$) may be determined by adding the change in temperature due to joule heating ($\Delta T_{joule}$) to the change in temperature due to device heating ($\Delta T_{channel}$) (i.e., $\Delta T_{real} = \Delta T_{joule} + \text{coefficient} \ast \Delta T_{channel}$). In some embodiments, the device self-heating ($\Delta T_{channel}$) of a first electrical network may affect an actual temperature of one or more metal interconnect wires within a neighboring electrical network, so that the change in real temperature ($\Delta T_{real}$) may be determined by adding the change in temperature due to joule heating ($\Delta T_{joule}$) to the change in temperature due to device heating of multiple channels (i.e., $\Delta T_{real} = \Delta T_{joule} + \text{coefficient\_1} \ast \Delta T_{channel\_1} + \text{coefficient\_2} \ast \Delta T_{channel\_2}$).

At 512, an average current margin/limit ($I_{AVG\_LIM}$) is calculated for the metal interconnect wire of the selected electrical network at an actual temperature ($T_{ACT}$) that is equal to a sum of an environmental temperature ($T_E$) and the change in real temperature ($\Delta T_{real}$). In some embodiments, the average current margin/limit ($I_{AVG\_LIM}$) of a metal interconnect wire may be a function of the actual temperature ($T_{ACT}$) of the electrical network and a width of the metal interconnect wire (i.e., $I_{AVG\_LIM} = f(\Delta T_{ACT}, \text{width})$).

At 514, an average current ($I_{AVG}$) on a metal interconnect wire is compared to the average current margin/limit ($I_{AVG\_LIM}$) of the metal interconnect wire. If the average current ($I_{AVG}$) is greater than the average current margin/limit, an EM violation is present on the metal interconnect wire (at 516) and the method proceeds to adjust the integrated chip design (e.g., a width of the metal interconnect wire) to reduce the average current of the selected electrical network (at 518).

Acts 512-518 of method 500 may be iteratively performed over a plurality of metal interconnect wires within an electrical network. For example, acts 512-518 may be performed a first time on a first metal interconnect wire within a first electrical network, a second time on a second metal interconnect wire within the first electrical network, etc. Furthermore, acts 502-518 may be iteratively performed over a plurality of electrical networks on the integrated chip design to separately determine EM violations on the separate electrical networks.

Figure 6A:
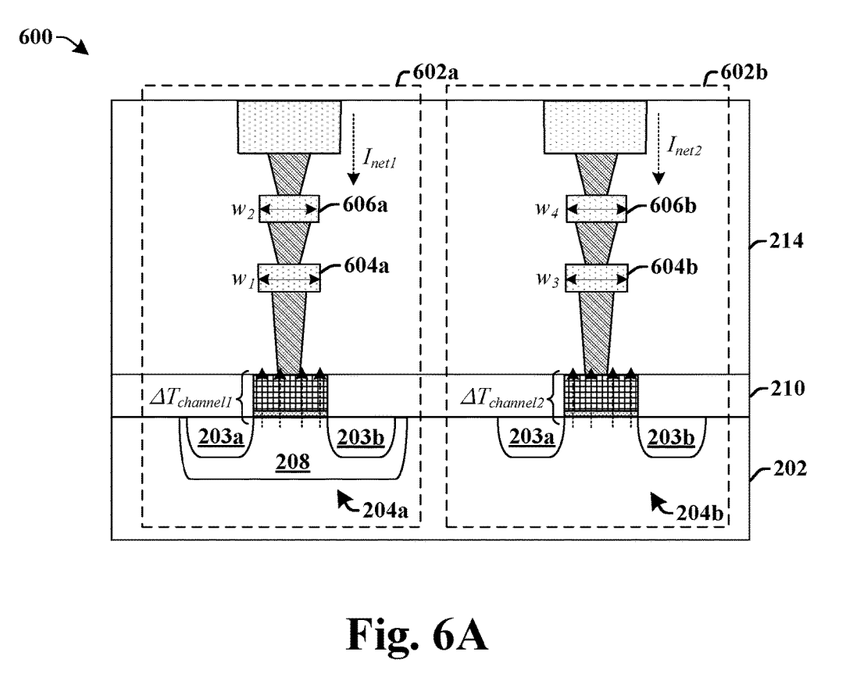
FIGS. 6A-6B illustrate cross-sectional views of some embodiments of an integrated chip experiencing device self-heating and resistive heating.
Figure 6B:
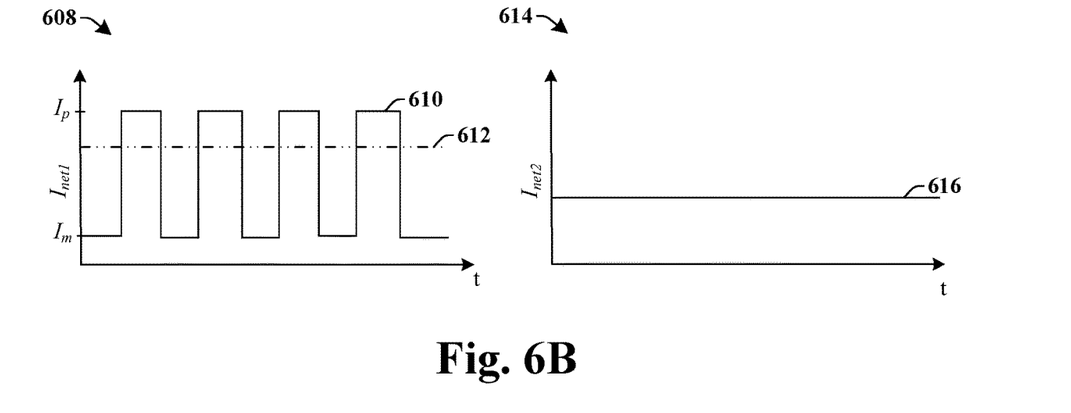

FIGS. 6A-6B illustrates some embodiments of determining a change in real temperature ($\Delta T_{real}$) due to device self-heating and resistive heating for a plurality of electrical networks.

FIG. 6A illustrates a cross-sectional view 600 of an integrated chip having a first electrical network 602a and a second electrical network 602b. The first electrical network 602a comprises a first plurality of metal interconnect wires, 604a and 606a, arranged over a first transistor device 204a. A first current $I_{net1}$ is provided through the first plurality of metal interconnect wires, 604a and 606a, in the first electrical network 602a. The second electrical network 602b comprises a second plurality of metal interconnect wires, 604b and 606b, arranged over a second transistor device 204b. A second current $I_{net2}$ is provided through the second plurality of metal interconnect wires, 604b and 606b, in the second electrical network 602b.

FIG. 6B illustrates some exemplary embodiments of a first graph 608 showing current (x-axis) as a function of time (y-axis) for the first electrical network 602a and a second graph 614 showing current (x-axis) as a function of time (y-axis) for the second electrical network 602b.

Within the first electrical network 602a, the change in real temperature of a metal interconnect wire, 604a or 606a, due to self heating is dependent upon a first change in temperature due to joule heating ($\Delta T_{joule1}$) of the metal interconnect wire and/or a first change in temperature due to device heating ($\Delta T_{channel1}$) that is induced on the metal interconnect wire from the underlying first transistor device 204a (e.g., due to the collision of charge carriers within semiconductor molecules within a channel of the first transistor device 204a). In some embodiments, the first change in temperature due to joule heating ($\Delta T_{joule1}$) may be calculated from an RMS current of the first electrical network 602a, since the first change in temperature due to joule heating ($\Delta T_{joule1}$) is a process by which the passage of an electric current through a conductor releases heat. As shown in the first graph 608, the current 610 on the first electrical network 602a has an alternating current that varies between a peak value of $I_p$ and a minimum value of $I_m$, resulting in an RMS current 612 having a first value (e.g., approximately equal to $I_p/\sqrt{2}$).

A first average EM current limit ($I_{AVG\_LIM1}$) may be determined for metal interconnect wire 604a based upon a first change in real temperature ($\Delta_{Treal\_1}$) due to self-heating and a first width $w_1$ of the metal interconnect wire 604a (i.e., $I_{AVG\_LIM1} = f(T_E + \Delta T_{real\_1}, w_1)$). An average current in the metal interconnect wire 604a is then determined and is compared to the first average EM current limit ($I_{AVG\_LIM1}$) to determine EM violations of the metal interconnect wire 604a. If an EM violation is present, a width of the metal interconnect wire 604a is increased from $w_1$ to a larger width. Increasing the width of the metal interconnect wire 604a may increase the first current margin/limit ($I_{AVG\_LIM1}$), which is a function of width, and thereby eliminates the EM violation. A second average EM current limit ($I_{AVG\_LIM2}$) may be determined for metal interconnect wire 606a based upon the first change in real temperature ($\Delta_{Treal\_1}$) due to self-heating and a second width $w_2$ of the metal interconnect wire 606a (i.e., $I_{AVG\_LIM2} = f(T_E \pm \Delta T_{real\_1}, w_2)$). An average current in the metal interconnect wire 606a is then determined and is compared to the second average EM current limit ($I_{AVG\_LIM2}$) to determine EM violations of the metal interconnect wire 606a. If an EM violation is present, a width of the metal interconnect wire 606a is increased from 1422 to a larger width.

In some embodiments, the self-heating ($\Delta T_{channel}$) of the second electrical network (e.g., 602b) may affect an actual temperature of one or more metal interconnect wires within the first electrical network (e.g., 602a). For example, in FIG. 6A, if metal interconnect wire 604a were to extend above the second transistor device 204b (but not be connected to the second electrical network 602b), metal interconnect wire 604a would be affected by self-heating of the first transistor device 204a and also by self-heating from the second transistor device 204b.

Once EM checks on the metal interconnect wires, 604a and 606a, within the first electrical network 602a have been completed, EM checks on the metal interconnect wires, 604b and 606b, within the second electrical network 602b may be performed. Within the second electrical network 602b, a second change in real temperature ($\Delta T_{real\_2}$) of a metal interconnect wire, 604b or 606b, due to self-heating is due to a second change in temperature due to joule heating ($\Delta T_{joule2}$) of the metal interconnect wire and/or a change in temperature due to device heating ($\Delta T_{channel2}$) induced on the metal interconnect wire from the underlying second transistor device 204b. In some embodiments, the second change in temperature due to joule heating ($\Delta T_{joule2}$) may be calculated from an RMS current of the second electrical network 602b. As shown in the second graph 614, the current 616 on the second electrical network 602b is a direct current, resulting in an RMS current having a second value that is equal to the direct current value and that is smaller than the first value of RMS current 612. The second value causes metal interconnect wires, 604b and 606b, on the second electrical network 602b to undergo less self-heating than the metal interconnect wire, 604b and 606b, in the first electrical network 602a, resulting in higher EM margins/limits.

A third average EM current limit ($I_{AVG\_LIM3}$) may be determined for the third metal interconnect wire 604b based upon the second change in real temperature ($\Delta T_{real\_2}$) due to self-heating and a third width $w_3$ of the third metal interconnect wire 604b (i.e., $I_{AVG\_LIM3}=f(T_E+\Delta T_{real\_2}, w_3)$). An average current in the third metal interconnect wire 604b is then determined and is compared to the third average EM current limit ($I_{AVG\_LIM3}$) to determine EM violations of the third metal interconnect wire 604b. If an EM violation is present, a width of the third metal interconnect wire 604b is increased from $w_3$ to a larger width. A fourth average EM current limit ($I_{AVG\_LIM4}$) may be determined for the fourth metal interconnect wire 606b based upon the second change in real temperature ($\Delta T_{real\_2}$) due to self-heating and a fourth width $w_4$ of the fourth metal interconnect wire 606b (i.e., $I_{AVG\_LIM4}=f(T_E+\Delta T_{real\_2}, w_4)$). An average current in the fourth metal interconnect wire 606b is then determined and is compared to the fourth average EM current limit ($I_{AVG\_LIM4}$) to determine EM violations of the fourth metal interconnect wire 606b. If an EM violation is present, a width of the fourth metal interconnect wire 606b is increased from $w_4$ to a larger width.

In some embodiments, the self-heating ($\Delta T_{channel}$) of the first electrical network (e.g., 602a) may affect an actual temperature of one or more metal interconnect wires within the second electrical network (e.g., 602b). For example, in FIG. 6A, if metal interconnect wire 604b were to extend above the first transistor device 204a (but not be connected to the first electrical network 602a), metal interconnect wire 604b would be affected by self-heating of the second transistor device 204b and also by self-heating from the first transistor device 204a.

Figure 7:
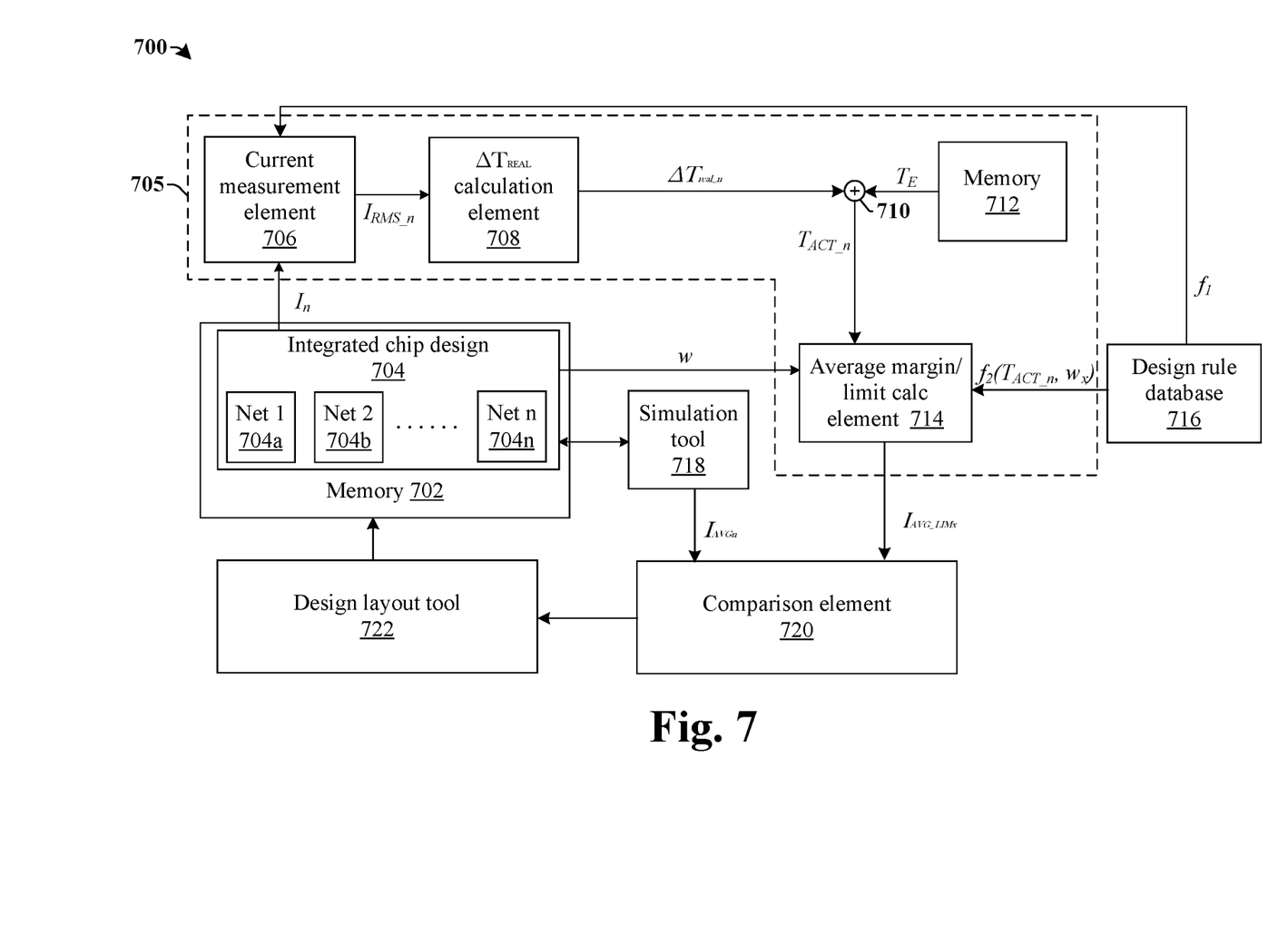
FIG. 7 illustrates a block diagram of some embodiments of a system for performing electromigration (EM) sign-off.

FIG. 7 illustrates some embodiments showing a block diagram of some embodiments of a system 700 for performing an electromigration sign-off. In some embodiments, one or more components of the system 700 may be comprised within an EDA (electronic design automation) tool.

The system 700 comprises a first memory element 702 configured to store an integrated chip design 704 (i.e., layout). The first memory element 702 comprises an electronic memory (e.g., RAM, solid state memory, etc.) configured to store digital data. The integrated chip design 704 comprises a plurality of different design layers (e.g., metal interconnect wire layers, metal via layers, etc.) that are arranged within a plurality of electrical networks 704a-704n.

An average current margin/limit determination element 705 is configured to determine electromigration margins/limits for one or more components within the plurality of electrical networks 704a-704n. In some embodiments, the electromigration margin/limit determination element 705 comprises a current measurement element 706 configured to measure a current ($I_n$) on one or more components within each of the plurality of electrical networks 704a-704n and to determine a plurality of RMS currents ($I_{RMS\_x}$, where x=1 to n) for the one or more components within the plurality of electrical networks 704a-704n in the integrated chip design 704. Each of the plurality of RMS currents ($I_{RMS\_x}$) corresponds to one or more components within one of the plurality of electrical networks 704a-704n in the integrated chip design 702. For example, a first RMS current $I_{RMS\_1}$ corresponds to one or more components within a first electrical network 704a, a second RMS current $I_{RMS\_2}$ corresponds to one or more components within a second electrical network 704b, etc. In some embodiments, the current measurement element 706 may be configured to receive a first formula ($f_1$) from a design rule database 716, which is used to calculate the plurality of RMS currents ($I_{RMS\_x}$). In some embodiments, the first formula ($f_1$) is dependent upon a technology node and/or fabrication process of the integrated chip design 704.

A change in real temperature calculation element 708 is configured to determine a change in real temperature ($\Delta T_{real\_x}$) for the one or more components within the plurality of electrical networks 704a-704n based upon the plurality of RMS currents ($I_{RMS\_x}$). The change in real temperature ($\Delta T_{real\_x}$) is added to an environmental temperature ($T_E$) by a summation element 710 to determine actual temperatures ($T_{ACT\_x}$) for the one or more components within respective ones of the plurality of electrical networks 704a-704n. In some embodiments, the environmental temperature ($T_E$) may be stored in a second memory element 712. In various embodiments, the second memory element 712 may be a same physical memory as the first memory element 702 or a different physical memory than the first memory element 702

The actual temperatures ($T_{ACT\_x}$) for the one or more components within the plurality of electrical networks 704a-704n are provided to an average current margin/limit calculation element 714 that is configured to calculate an average current margin/limit ($I_{AVG\_LIM1}$) for the one or more components within the plurality of electrical networks 704a-704n at an actual temperature ($T_{ACT\_x}$) corresponding to the one or more components of a selected electrical network 704a-704n. For example, the current margin/limit calculation element 714 may calculate a first average current margin/limit ($I_{AVG\_LIM1}$) for a first metal interconnect wire within a first electrical network 704a at a first actual temperature ($T_{ACT\_1}$), a second average current margin/limit ($I_{AVG\_LIM2}$) for a second metal interconnect wire within a second electrical network 704b at a second actual temperature ($T_{ACT\_2}$), etc. In some embodiments, the average current margin/limit calculation element 714 may be configured to receive a second formula ($f_2$) to calculate the average current margin/limit ($I_{AVG\_LIMx}$) from the design rule database 716. The second formula ($f_2$) may be dependent upon a technology node and/or fabrication process of the integrated chip design 704.

A simulation tool 718 is configured to determine average currents ($I_{AVGx}$) for the one or more components within the plurality of electrical networks 704a-704n from the integrated chip design 704. The average currents ($I_{AVGx}$) and the average current margin/limit ($I_{AVG\_LIMx}$) are provided to a comparison element 720 that is configured to identify electromigration violations by comparing the average currents ($I_{AVGx}$) to the average current margin/limit ($I_{AVG\_LIMx}$). For example, if the average current ($I_{AVGx}$) of a metal interconnect wire within an electrical network violations an average current margin/limit ($I_{AVG\_LIMx}$) of that electrical network an electromigration violation is identified. In some embodiments, the simulation tool may comprise a Simulation Program with Integrated Circuit Emphasis (SPICE) simulator.

A design layout tool 722 is configured to adjust one or more design layers corresponding to the one or more components within one of plurality of electrical networks 704a-704n based upon an output of the comparison element 720. The one or more design layers may be adjusted to increase a width of a metal interconnect wire if an electromigration violation is determined to be present within the electrical network. Alternatively the one or more design layers may be adjusted to decrease a width of a metal interconnect wire if the average current is determined to be below the average current margin/limit.

Therefore, the present disclosure relates to an electromigration (EM) sign-off methodology that determines EM violations on different electrical networks by performing a single EM check on each network. The single EM checks are performed by comparing an electromigration metric (e.g., average current) to an electromigration margin/limit of the different electrical networks determined using separate temperatures.

In some embodiments, the present disclosure relates to a method of performing electromigration sign-off. The method comprises determining a plurality of actual temperatures that respectively correspond to or more components within one of a plurality of electrical networks within an integrated chip design. The method further comprises determining an electromigration margin for a component within a selected electrical network of the plurality of electrical networks, wherein the electromigration margin is determined at one of the plurality of actual temperatures that corresponds to the component within the selected electrical network. The method further comprises comparing the electromigration margin to an electromigration metric to determine if an electromigration violation of the component within the selected electrical network is present.

In other embodiments, the present disclosure relates to a method of performing electromigration sign-off. The method comprises determining a first actual temperature corresponding to a first metal interconnect wire within a first electrical network of an integrated chip design, and determining a second actual temperature corresponding to a second metal interconnect wire within a second electrical network of the integrated chip design. The method further comprises determining a first average current limit for the first metal interconnect wire using the first actual temperature, and determining a second average current limit for the second metal interconnect wire using the second actual temperature. The method further comprises comparing a first average current on the first metal interconnect wire to the first average current limit to determine an electromigration violation within the first metal interconnect wire, and comparing a second average current on the second metal interconnect wire to the second average current limit to determine an electromigration violation within the second metal interconnect wire.

In yet other embodiments, the present disclosure relates to a system for performing electromigration sign-off. The system comprises a memory element configured to store an integrated chip design comprising a plurality of electrical networks. The system further comprises an electromigration margin determination element configured to determine a plurality of actual temperatures that respectively correspond to one or more components within one of the plurality of electrical networks within the integrated chip design, and to determine an electromigration margin for a component within a selected electrical network of the plurality of electrical networks, wherein the electromigration margin is determined at one of the plurality of actual temperatures that corresponds to the component within the selected electrical network. The system further comprises a comparison element configured to compare the electromigration margin to an electromigration metric to determine if an electromigration violation of the component within the selected electrical network is present.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An electromigration sign-off tool, comprising:
electronic memory configured to store an integrated chip design that is to be used to form an integrated chip, and to further store an environmental temperature having a same value corresponding to a plurality of interconnect wires within the integrated chip design;
an adder configured to add the environmental temperature to a plurality of real temperatures to determine a plurality of actual temperatures having different values corresponding to different ones of the plurality of interconnect wires, wherein the plurality of real temperatures account for Joule heating on the plurality of interconnect wires;
an average current limit calculation element configured to determine an average current limit at a first one of the plurality of actual temperatures corresponding to a first interconnect wire of the plurality of interconnect wires; and
a comparator configured to determine an electromigration violation on the first interconnect wire by comparing the average current limit to an average current corresponding to the first interconnect wire.

2. The electromigration sign-off tool of claim 1, wherein the average current limit is a boundary on a current in the first interconnect wire above which electromigration violations are present.

3. The electromigration sign-off tool of claim 1, wherein the integrated chip design comprises a plurality of electrical networks respectively comprising one or more of the plurality of interconnect wires.

4. The electromigration sign-off tool of claim 2, further comprising:
a current measurement element configured to determine currents on the plurality of interconnect wires and to determine a plurality of root mean square (RMS) currents for the plurality of interconnect wires.

5. The electromigration sign-off tool of claim 4, further comprising:
a real temperature calculation element configured to determine the plurality of real temperatures using the plurality of RMS currents.

6. The electromigration sign-off tool of claim 1, wherein the plurality of actual temperatures account for effects of the Joule heating and device self-heating on the environmental temperature.

7. The electromigration sign-off tool of claim 6, wherein the device self-heating is due to heat generated by charge carriers within a first channel region of a first transistor device within the integrated chip design.

8. The electromigration sign-off tool of claim 6, wherein the device self-heating is due to heat generated by multiple transistor devices within the integrated chip design.

9. The electromigration sign-off tool of claim 1, further comprising:
a simulation tool configured to determine the average current corresponding to the first interconnect wire from the integrated chip design.

10. The electromigration sign-off tool of claim 1, further comprising:
a design layout tool configured to adjust a width of the first interconnect wire based upon an output of the comparator.

11. A system for performing electromigration sign-off, comprising:
electronic memory configured to store an integrated chip design comprising a plurality of electrical networks;
a real temperature calculation element configured to determine a plurality of real temperatures, which respectively correspond to one of the plurality of electrical networks within the integrated chip design, using a plurality of RMS currents corresponding to the plurality of electrical networks, wherein the plurality of real temperatures comprise a first real temperature corresponding to a first interconnect within a first electrical network of the plurality of electrical networks, the first real temperature accounting for heat generated by charge carriers within a first channel region of a first transistor device within the first electrical network and for heat generated by charge carriers within a second channel region of a second transistor device within a second electrical network of the plurality of electrical networks that is adjacent to the first electrical network;
an adder configured to determine a plurality of actual temperatures by adding the plurality of real temperatures to an environmental temperature having a same value for the plurality of electrical networks;
an average current limit calculator configured to determine an average current limit for a selected electrical network of the plurality of electrical networks using one of the plurality of actual temperatures that corresponds to the selected electrical network; and
a comparison element configured to identify an electromigration violation within the selected electrical network by comparing the average current limit to an average current on an interconnect within the selected electrical network.

12. The system of claim 11, wherein the plurality of real temperatures represent effects of Joule heating and device self-heating on interconnects within the plurality of electrical networks.

13. The system of claim 11, further comprising:
a current measurement element configured to determine a current on one or more interconnects within respective ones of the plurality of electrical networks and to determine the plurality of RMS currents for the one or more interconnects.

14. The system of claim 11, further comprising:
a simulation tool configured to determine the average current for the interconnect from the integrated chip design.

15. The system of claim 11, wherein the plurality of real temperatures are different for different interconnects within a same one of the plurality of electrical networks.

16. A tool for performing electromigration sign-off, comprising:
electronic memory configured to store an integrated chip design that is to be used to form an integrated chip within a semiconductor substrate, and to further store an environmental temperature having a same value corresponding to a plurality of interconnect wires within the integrated chip design;
a real temperature calculation element configured to determine a first real temperature of a first interconnect wire by adding a change in temperature due to Joule heating of the first interconnect wire and a change in temperature due to heat associated with a transistor device below the first interconnect wire;
an adder configured to add the environmental temperature to the first real temperature to determine a first actual temperature corresponding to the first interconnect wire; and
an average current limit calculator configured to use the first actual temperature to determine a first average current limit that defines a boundary on a numerical average of current in the first interconnect wire that is indicative of an electromigration violation.

17. The tool of claim 16, further comprising:
a comparison element configured to identify the electromigration violation within the first interconnect wire by comparing the first average current limit to an average current on the first interconnect wire.

18. The tool of claim 17, further comprising:
a design layout tool configured to increase a width of the first interconnect wire if the electromigration violation is identified within the first interconnect wire.

19. The tool of claim 16, wherein the heat associated with the transistor device is generated by charge carriers within a channel region of the transistor device.

20. The tool of claim 17,
wherein the average current limit calculator is further configured to determine a second average current limit for a second interconnect wire at a second actual temperature different than the first actual temperature, the first interconnect wire and the second interconnect wire arranged on a same electrical network; and
wherein the comparison element is further configured to identify a second electromigration violation within the second interconnect wire by comparing the second average current limit to a second average current on the second interconnect wire.

* * * * *